United States Patent
Song et al.

(10) Patent No.: US 9,330,945 B2
(45) Date of Patent: May 3, 2016

(54) INTEGRATED CIRCUIT PACKAGE SYSTEM WITH MULTI-CHIP MODULE

(75) Inventors: Sungmin Song, Inchon (KR); SeungYun Ahn, Ichon-si (KR); JoHyun Bae, Seoul (KR); Jong-Woo Ha, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 1129 days.

(21) Appl. No.: 11/857,188

(22) Filed: Sep. 18, 2007

(65) Prior Publication Data
US 2009/0072375 A1 Mar. 19, 2009

(51) Int. Cl.
| | | |
|---|---|---|
| H01L 21/56 | (2006.01) | |
| H01L 23/31 | (2006.01) | |
| H01L 25/03 | (2006.01) | |
| H01L 25/065 | (2006.01) | |
| H01L 25/10 | (2006.01) | |
| H01L 23/00 | (2006.01) | |

(52) U.S. Cl.
CPC .......... *H01L 21/563* (2013.01); *H01L 23/3128* (2013.01); *H01L 25/03* (2013.01); *H01L 25/0657* (2013.01); *H01L 25/105* (2013.01); *H01L 24/48* (2013.01); *H01L 2224/0401* (2013.01); *H01L 2224/06135* (2013.01); *H01L 2224/06136* (2013.01); *H01L 2224/16225* (2013.01); *H01L 2224/32145* (2013.01); *H01L 2224/32225* (2013.01); *H01L 2224/4824* (2013.01); *H01L 2224/48091* (2013.01); *H01L 2224/48225* (2013.01); *H01L 2224/48227* (2013.01); *H01L 2224/73203* (2013.01); *H01L 2224/73215* (2013.01); *H01L 2224/73253* (2013.01); *H01L 2224/73265* (2013.01); *H01L 2225/0651* (2013.01); *H01L 2225/0652* (2013.01); *H01L 2225/06517* (2013.01); *H01L 2225/06558* (2013.01); *H01L 2225/1023* (2013.01); *H01L 2225/1058* (2013.01); *H01L 2225/1088* (2013.01); *H01L 2924/12041* (2013.01); *H01L 2924/15311* (2013.01); *H01L 2924/1815* (2013.01); *H01L 2924/19107* (2013.01); *H01L 2924/3511* (2013.01)

(58) Field of Classification Search
USPC .......................................................... 257/686
See application file for complete search history.

(56) References Cited

U.S. PATENT DOCUMENTS

| | | | |
|---|---|---|---|
| 6,338,980 B1* | 1/2002 | Satoh .............................. | 438/106 |
| 6,881,611 B1* | 4/2005 | Fukasawa et al. ............. | 438/114 |
| 6,946,323 B1* | 9/2005 | Heo ........................ | H01L 25/03 257/E25.002 |
| 7,364,945 B2* | 4/2008 | Shim et al. .................... | 438/109 |
| 7,429,786 B2* | 9/2008 | Karnezos et al. ............. | 257/686 |
| 7,833,881 B2* | 11/2010 | Farnworth ..................... | 438/460 |
| 2004/0113283 A1* | 6/2004 | Farnworth et al. ............ | 257/782 |
| 2004/0178499 A1* | 9/2004 | Mistry ..................... | H01L 21/56 257/734 |
| 2005/0167798 A1* | 8/2005 | Doan ............................. | 257/678 |
| 2005/0224969 A1* | 10/2005 | Wu ................................ | 257/737 |
| 2006/0097402 A1* | 5/2006 | Pu ........................ | H01L 23/3128 257/777 |

(Continued)

*Primary Examiner* — Jenny L Wagner
*Assistant Examiner* — Abbigale Boyle
(74) *Attorney, Agent, or Firm* — Ishimaru & Associates LLP

(57) ABSTRACT

An integrated circuit package system with multi-chip module is provided including: providing an upper substrate having an upper chip thereon; positioning a lower chip under the upper chip, the lower chip having bottom interconnects thereon; encapsulating the upper chip and the lower chip with a chip encapsulant on the upper substrate with the bottom interconnects exposed; mounting the lower chip over a lower substrate with a gap between the chip encapsulant and the lower substrate; and filling the gap with a package encapsulant or chip attach adhesive.

14 Claims, 3 Drawing Sheets

(56) References Cited

U.S. PATENT DOCUMENTS

| | | | |
|---|---|---|---|
| 2006/0189033 A1* | 8/2006 | Kim | 438/109 |
| 2006/0220256 A1* | 10/2006 | Shim et al. | 257/777 |
| 2007/0063331 A1 | 3/2007 | Kwon et al. | |
| 2007/0187826 A1 | 8/2007 | Shim et al. | |
| 2007/0190690 A1 | 8/2007 | Chow et al. | |
| 2007/0200230 A1 | 8/2007 | Chow et al. | |
| 2007/0200257 A1 | 8/2007 | Chow et al. | |
| 2007/0216006 A1 | 9/2007 | Park et al. | |
| 2008/0111233 A1 | 5/2008 | Pendse | |
| 2008/0136003 A1 | 6/2008 | Pendse | |

* cited by examiner

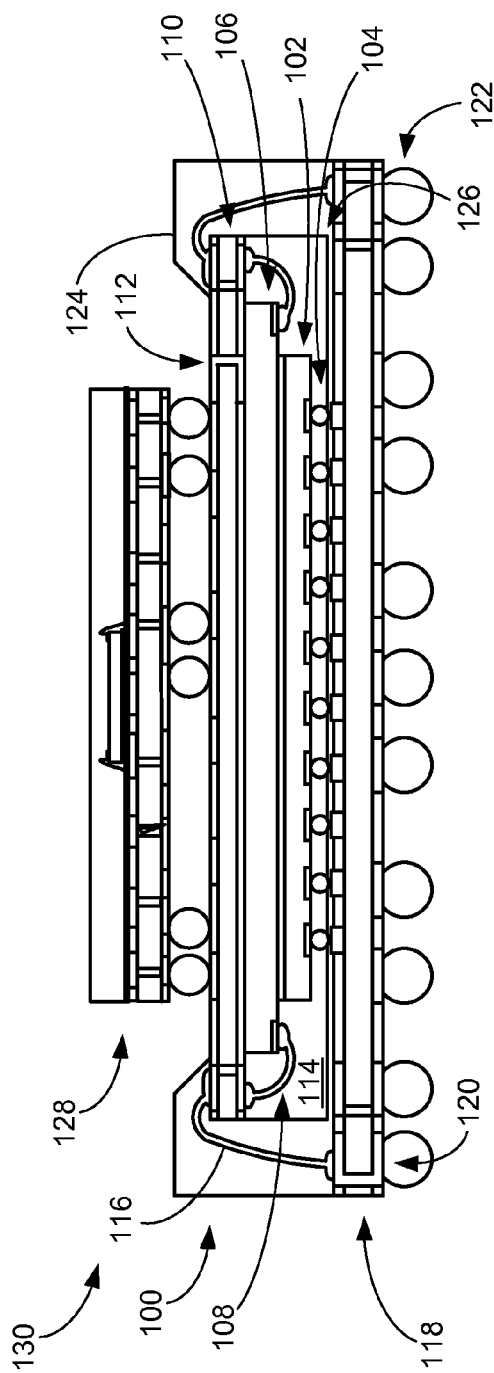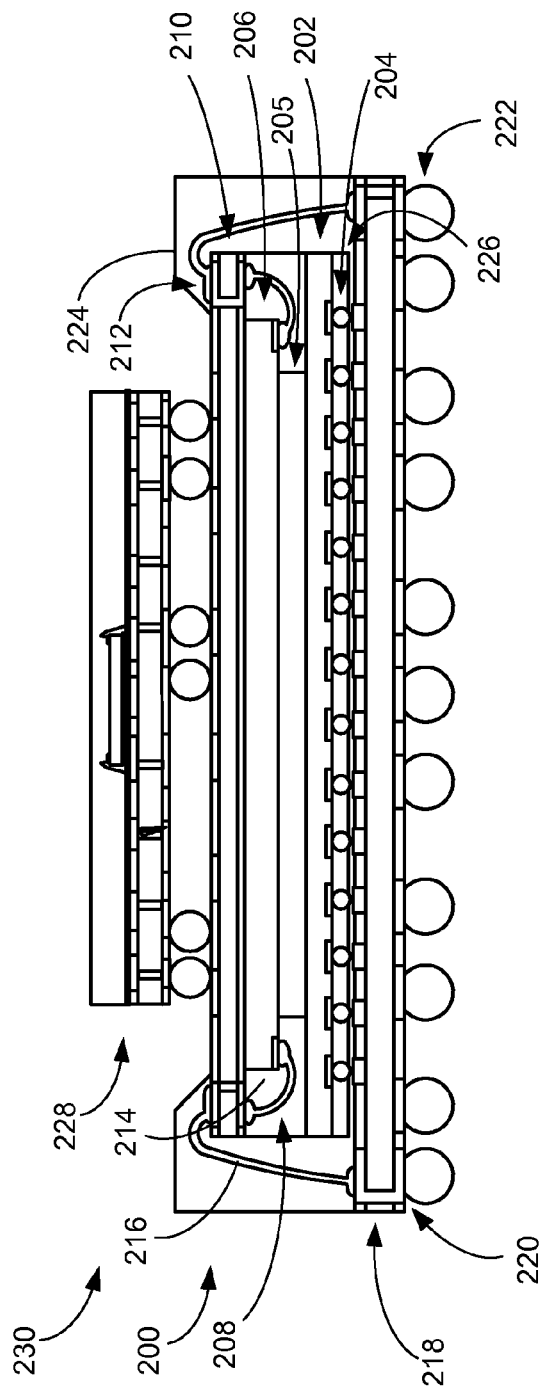

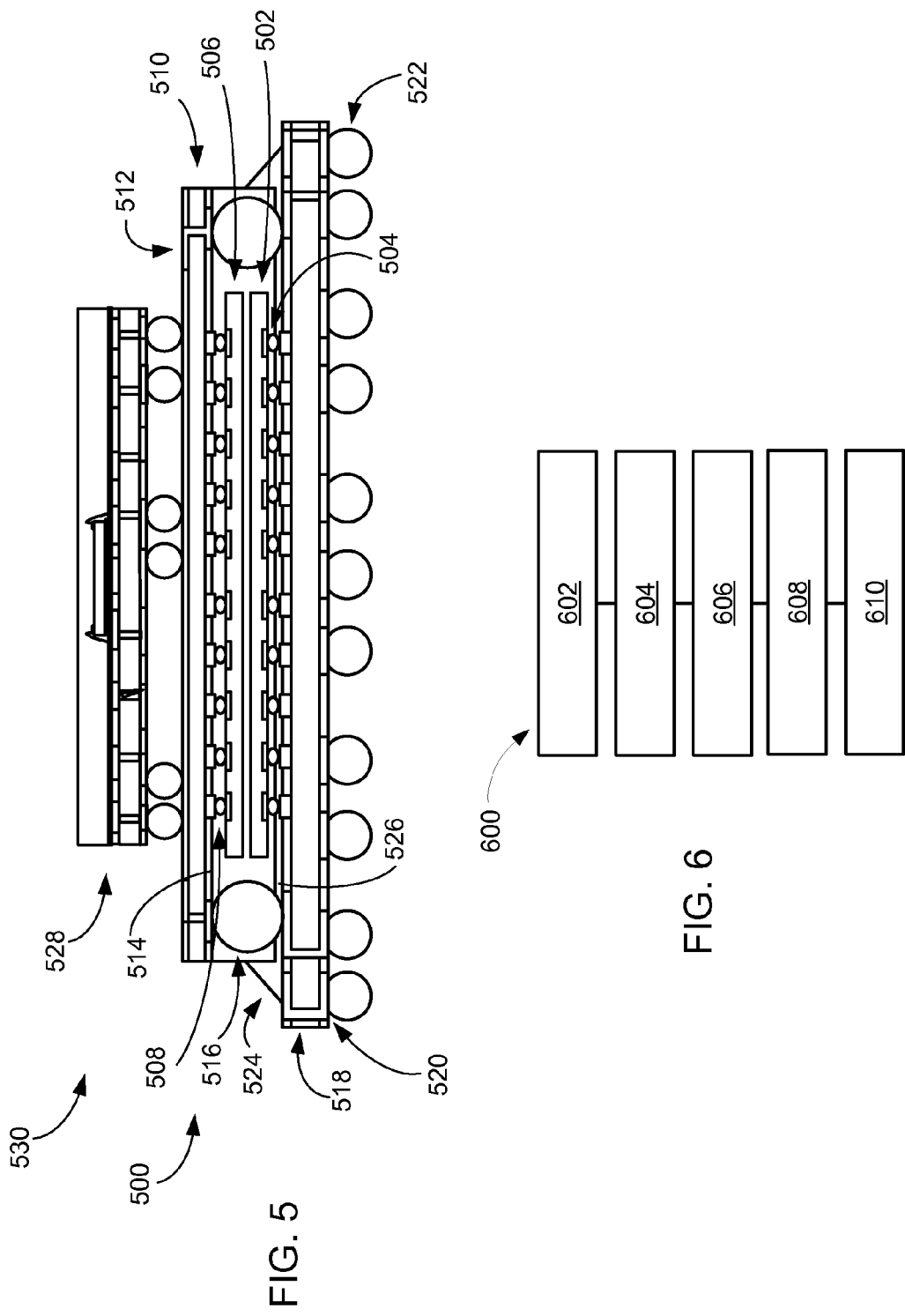

INTEGRATED CIRCUIT PACKAGE SYSTEM WITH MULTI-CHIP MODULE

TECHNICAL FIELD

The present invention relates generally to package-on-package integrated circuit package systems, and more particularly to an integrated circuit package system with a package module over a substrate.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a printed circuit board substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, the individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. The substrate and integrated circuit are often damaged during assembly or testing, complicating the manufacturing process and increasing costs. The vertically stacked integrated circuit problems can be greater than the benefits.

In addition, multi-chip packages generally provide higher density of integrated circuits but present yet other challenges. Additional structures, such as printed circuit boards, middle substrates, or flexible wiring, must be currently used to connect the integrated circuits in the multi-chip package. These additional structures add cost, manufacturing complexity, potential failure areas, and potential reliability problems.

The conventional fan in package-on-package integrated circuit system has a wire bonded bottom tie and an internal stacking module (ISM) stacked on top with an exposed surface after molding to allow mounting other devices.

The difficulty with such devices is that delamination often occurs between the wire bonded bond die spacer and the inverted ISM.

The conventional package-on-package design requires many process steps, which require a long time for assembly and makes the end product expensive.

Further, package warpage between the packages may result in defective solder joints leading to open circuits.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system with multi-chip module including: providing an upper substrate having an upper chip thereon; positioning a lower chip under the upper chip, the lower chip having bottom interconnects thereon; encapsulating the upper chip and the lower chip with a chip encapsulant on the upper substrate with the bottom interconnects exposed; mounting the lower chip over a lower substrate with a gap between the chip encapsulant and the lower substrate; and filling the gap with a package encapsulant or chip attach adhesive.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 1 is a view of a multi-chip module in accordance with a first embodiment of the present invention;

FIG. 2 is a view of a multi-chip module in accordance with a second embodiment of the present invention;

FIG. 5 is a view of a multi-chip module in accordance with a fifth embodiment of the present invention; and FIG. 6 is a flow chart for an integrated circuit package system for manufacturing the integrated circuit package system of FIG. 1.

BEST MODE FOR CARRYING OUT THE INVENTION

Figure 3:
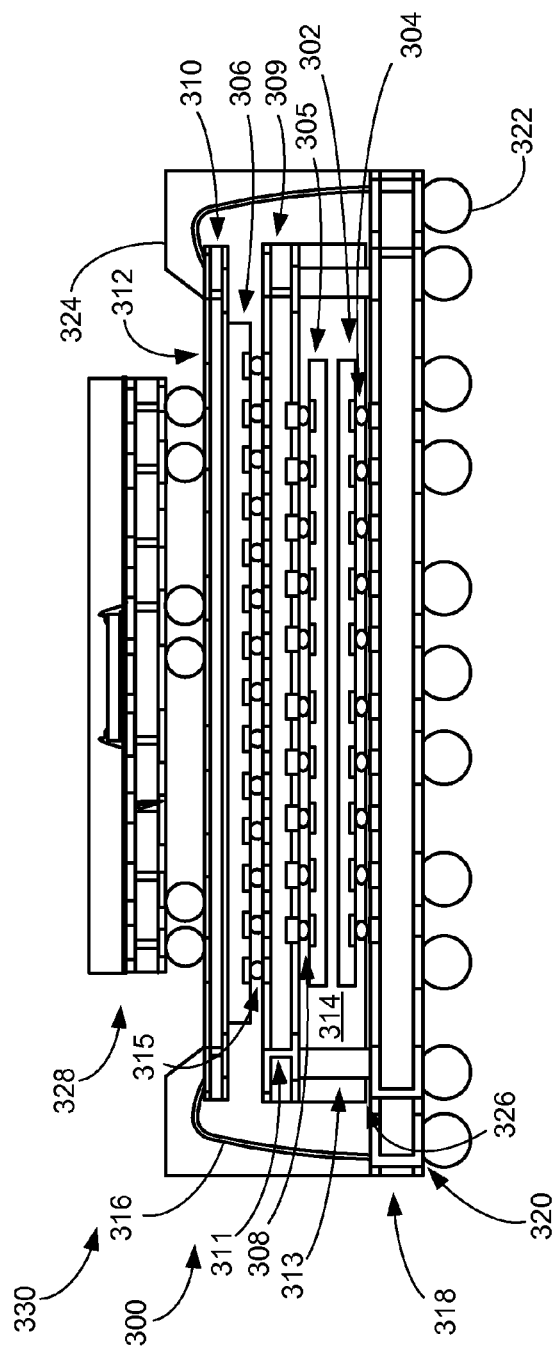
FIG. 3 is a view of a multi-chip module in accordance with a third embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown exaggerated in the drawing FIGs.

Similarly, although the views in the drawings for ease of description generally show similar orientations, this depiction in the FIGs. is arbitrary for the most part. Generally, the invention can be operated in any orientation. Also, where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the semiconductor chip, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements and the term "over" means that there is no such direct contact. The term "system" means the method and the apparatus of the present invention as will be apparent from context. The term "processing" as used herein includes stamping, forging, patterning, exposure, development, etching, cleaning, and/or removal of material or laser trimming as required in forming a described structure.

Referring now to FIG. 1, therein is shown a multi-chip module 100 in accordance with a first embodiment of the present invention.

The multi-chip module 100 includes a lower chip 102 having interconnects 104, such as solder bumps. The lower chip 102 is attached to an upper chip 106 having interconnects 108, such as bond wires. The upper chip 106 is attached to an upper substrate 110 having vias and wires 112 therein for attachment of other packages or devices 128. The interconnects 108 connect the upper chip 106 electrically to the vias and wires 112 of the upper substrate 110.

The lower chip 102, the upper chip 106, and the interconnects 108 are encapsulated in a chip encapsulant 114, which forms a package over the lower substrate 118 and on the upper substrate 110. The chip encapsulant 114 also encapsulates the interconnects 104 but leaves them exposed for interconnection at the bottoms thereof. The chip encapsulant 114 is fully separated from the lower substrate 118 by a gap 126.

Interconnects 116, such as bond wires, connect the upper substrate 110 to a lower substrate 118 having vias and wires 120. The vias and wires 120 interconnect the interconnects 116 to main interconnects 122, such as a ball grid array (BGA). The vias and wires 120 further connect the interconnects 104 to the main interconnects 122.

A module encapsulant 124 encapsulates the perimeter of the upper substrate 110, the interconnects 116, the interconnects 104, and the chip encapsulant 114 over the lower substrate 118. The module encapsulant 124 fills the gap 126 between the chip encapsulant 114 and the lower substrate 118. The interconnects 104 of the lower chip 102 extend through the gap 126 and are directly on the lower chip 102 and the lower substrate 118. It has been discovered that filling the gap 126 in this way eliminates the possibility of delamination between the lower chip 102 and the lower substrate 118.

The multi-chip module 100 is part of a package-on-package configuration, which means that the module encapsulant 124 encapsulates the perimeter of the upper substrate 110 to allow another known-good package 128 to be attached to the vias and wires 112 of the upper substrate 110. The encapsulant 124 covers a portion of the upper substrate 110 on a side of the upper substrate 110 opposite the upper chip 106, the lower chip 102, or the lower substrate 118. The combination of the multi-chip module 100 and the known-good package 128 makes up an integrated package system 130.

Referring now to FIG. 2, therein is shown a multi-chip module 200 in accordance with a second embodiment of the present invention.

The multi-chip module 200 includes a lower chip 202 having interconnects 204, such as solder bumps. The lower chip 202 is attached to a dielectric spacer 205, which is attached to an upper chip 206 having interconnects 208, such as bond wires. The upper chip 206 is attached to an upper substrate 210 having vias and wires 212 therein for attachment of other packages or devices 228. The interconnects 208 connect the upper chip 206 electrically to the vias and wires 212 of the upper substrate 210.

The lower chip 202, the dielectric spacer 205, the upper chip 206, and the interconnects 208 are encapsulated in a chip encapsulant 214, which forms a package over the lower substrate 218. The spacer 205 protects the interconnects 208 from contact with the upper chip 206. The chip encapsulant 214 also encapsulates the interconnects 204 but leaves them exposed for interconnection at the bottoms thereof to the lower substrate 218.

Interconnects 216, such as bond wires, connect the upper substrate 210 to a lower substrate 218 having vias and wires 220. The vias and wires 220 interconnect the interconnects 216 to main interconnects 222, such as a ball grid array (BGA). The vias and wires 220 further connect the interconnects 204 to the main interconnects 222.

A module encapsulant 224 encapsulates the perimeter of the upper substrate 210, the interconnects 216, and the interconnects 204 over the lower substrate 218. The module encapsulant 224 fills a gap 226 between the chip encapsulant 214 and the lower substrate 218. It has been discovered that filling the gap 226 in this way eliminates the possibility of delamination between the lower chip 202 and the lower substrate 218.

The multi-chip module 200 is part of a package-on-package configuration, which means that the module encapsulant 224 encapsulates the perimeter of the upper substrate 210 to allow another known-good package 228 to be attached to the vias and wires 212 of the upper substrate 210. The combination of the multi-chip module 200 and the known-good package 228 makes up an integrated package system 230.

Referring now to FIG. 3, therein is shown a multi-chip module 300 in accordance with a third embodiment of the present invention.

The multi-chip module 300 includes a lower chip 302 having interconnects 304, such as solder bumps. The lower chip 302 is spaced from a middle chip 305 having interconnects 308, such as solder bumps. The middle chip 305 is attached to a middle substrate 309 having vias and wires 311. Interconnects 313, such as studs or columns, connect the vias and wires 311 on the middle substrate 309 to a lower substrate 318.

An upper chip 306 is attached to the middle substrate 309 by interconnects 315, such as solder bumps. The upper chip 306 is attached to an upper substrate 310 having vias and wires 312 therein for attachment of other packages or devices 328.

The lower chip 302, the middle chip 305, and the interconnects 308 are encapsulated in a chip encapsulant 314, which forms a package over the lower substrate 318. The chip encapsulant 314 also encapsulates the interconnects 304 but leaves them exposed for interconnection at the bottoms thereof.

Upper substrate interconnects 316, such as bond wires, connect the upper substrate 310 to the lower substrate 318 having vias and wires 320. The vias and wires 320 interconnect the upper substrate interconnects 316 to main interconnects 322, such as a ball grid array (BGA). The vias and wires 320 further connect the interconnects 304 to the main interconnects 322.

A module encapsulant 324 encapsulates the perimeter of the upper substrate 310, the interconnects 316, and the interconnects 304 over the lower substrate 318. The module encapsulant 324 fills a gap 326 between the chip encapsulant 314 and the lower substrate 318. It has been discovered that filling the gap 326 in this way eliminates the possibility of delamination between the lower chip 302 and the lower substrate 318.

The multi-chip module 300 is part of a package-on-package configuration, which means that the module encapsulant 324 encapsulates the perimeter of the upper substrate 310 to allow another known-good package 328 to be attached to the vias and wires 312 of the upper substrate 310. The combination of the multi-chip module 300 and the known-good package 328 makes up an integrated package system 330.

Figure 4:
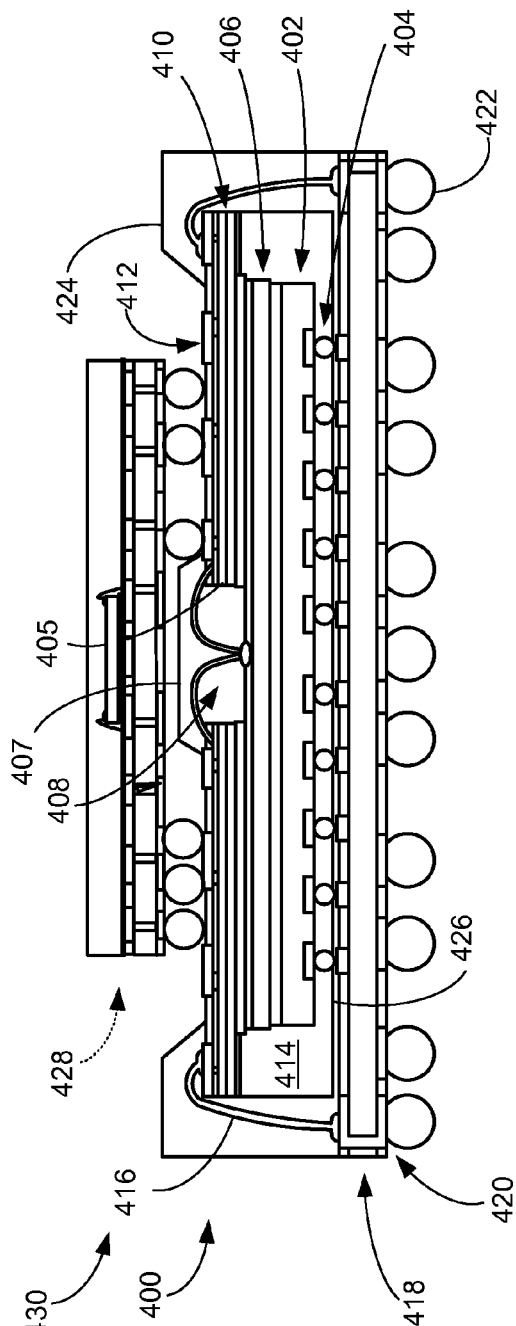
FIG. 4 is a view of a multi-chip module in accordance with a fourth embodiment of the present invention.

Referring now to FIG. 4, therein is shown a multi-chip module 400 in accordance with a fourth embodiment of the present invention.

The multi-chip module 400 includes a lower chip 402 having interconnects 404, such as solder bumps. The lower chip 402 is attached to an upper chip 406 having interconnects 408, such as bond wires. The upper chip 406 is attached to an upper substrate 410 having vias and wires 412 therein for attachment of other packages or devices 428. The interconnects 408 extend through an opening 405 in the upper substrate 410 and are encapsulated in an interconnect encapsulant 407. The interconnects 408 connect the top of the upper chip 406 electrically to the vias and wires 412 of the top of the upper substrate 410.

The lower chip 402 and the upper chip 406 are encapsulated in a chip encapsulant 414, which forms a package over the lower substrate 418. The chip encapsulant 414 also encapsulates the interconnects 404 but leaves them exposed for interconnection at the bottoms thereof.

Interconnects 416, such as bond wires, connect the upper substrate 410 to a lower substrate 418 having vias and wires 420. The vias and wires 420 interconnect the interconnects 416 to main interconnects 422, such as a ball grid array (BGA). The vias and wires 420 further connect the interconnects 404 to the main interconnects 422.

A module encapsulant 424 encapsulates the perimeter of the upper substrate 410, the interconnects 416, and the interconnects 404 over the lower substrate 418. The module encapsulant 424 fills a gap 426 between the chip encapsulant 414 and the lower substrate 418. It has been discovered that filling the gap 426 in this way eliminates the possibility of delamination between the lower chip 402 and the lower substrate 418.

The multi-chip module 400 is part of a package-on-package configuration, which means that the module encapsulant 424 encapsulates the perimeter of the upper substrate 410 to allow another known-good package 428 to be attached to the vias and wires 412 of the top of the upper substrate 410. The combination of the multi-chip module 400 and the known-good package 428 makes up an integrated package system 430.

Referring now to FIG. 5, therein is shown a multi-chip module 500 in accordance with a fifth embodiment of the present invention.

The multi-chip module 500 includes a lower chip 502 having interconnects 504, such as solder bumps. The lower chip 502 is spaced from an upper chip 506 having interconnects 508, such as solder bumps. The upper chip 506 is attached to an upper substrate 510 having vias and wires 512 therein for attachment of other packages or devices 528. The interconnects 508 connect the upper chip 506 electrically to the vias and wires 512 of the upper substrate 510.

The lower chip 502, the upper chip 506, and the interconnects 508 are encapsulated in a chip encapsulant 514, which forms a package over the lower substrate 518. The chip encapsulant 514 also encapsulates the interconnects 504 but leaves them exposed for interconnection at the bottoms thereof.

Interconnects 516, such as solder balls, connect the upper substrate 510 to a lower substrate 518 having vias and wires 520. The vias and wires 520 interconnect the interconnects 516 to main interconnects 522, such as a ball grid array (BGA). The vias and wires 520 further connect the interconnects 504 to the main interconnects 522.

A chip attach adhesive 524 encapsulates the perimeter of the chip encapsulant 514 and the interconnects 504 on the lower substrate 518. The chip attach adhesive 524 fills a gap 526 between the chip encapsulant 514 and the lower substrate 518. It has been discovered that filling the gap 526 in this way eliminates the possibility of delamination between the lower chip 502 and the lower substrate 518.

The multi-chip module 500 is part of a package-on-package configuration, which means that the upper substrate 110 allows another known-good package 528 to be attached to the vias and wires 512 of the upper substrate 510. The combination of the multi-chip module 500 and the known-good package 528 makes up an integrated package system 530.

Referring now to FIG. 6, therein is shown a flow chart for an integrated circuit package system 600 for manufacturing the integrated circuit package system 130. The integrated circuit package system 600 includes: providing an upper substrate having an upper chip thereon in a block 602; positioning a lower chip under the upper chip, the lower chip having bottom interconnects thereon in a block 604; encapsulating the upper chip and the lower chip with a chip encapsulant on the upper substrate with the bottom interconnects exposed in a block 606; mounting the lower chip over a lower substrate with a gap between the chip encapsulant and the lower substrate in a block 608; and filling the gap with a package encapsulant or chip attach adhesive in a block 610.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method for manufacturing an integrated circuit package system with multi-chip module comprising:

providing an upper substrate having an upper chip thereon;

positioning a lower chip under the upper chip, the lower chip having bottom interconnects thereon;

encapsulating the upper chip and the lower chip with a chip encapsulant on the upper substrate with the bottom interconnects exposed from the chip encapsulant;

mounting the lower chip over the lower substrate with the bottom interconnects extended through a gap between the chip encapsulant and the lower substrate, the bottom interconnects directly on the lower substrate, the chip encapsulant fully separated from the lower substrate by the gap; and filling the gap with a package encapsulant with a portion of a surface of the upper substrate opposite the upper chip covered by the package encapsulant.

2. The method as claimed in claim 1 further comprising interconnecting the upper chip and the upper substrate.

3. The method as claimed in claim 1 further comprising spacing the upper chip from the lower chip to prevent contact between interconnections between the upper chip and the upper substrate, and the lower chip.

4. The method as claimed in claim 1 wherein positioning the lower chip positions a lower chip larger than the upper chip.

5. The method as claimed in claim 1 further comprising:
providing a middle substrate having a middle chip thereon;
connecting the upper chip to the middle substrate; and
connecting the middle substrate to the lower substrate.

6. The method as claimed in claim 1 wherein:
providing the upper substrate provides the upper substrate with an opening provided therein; and
interconnecting the upper chip and the upper substrate through the opening.

7. The method as claimed in claim 1 further comprising connecting a second package to the upper substrate.

8. A method for manufacturing an integrated circuit package system with multi-chip module comprising:
providing an upper substrate having an upper chip thereon and having interconnects therebetween;
positioning a lower chip under the upper chip, the lower chip having bottom interconnects thereon;
encapsulating the upper chip and the lower chip with a chip encapsulant on the upper substrate with the bottom interconnects exposed from the chip encapsulant;
mounting the lower chip over the lower substrate with the bottom interconnects extended through a gap between the chip encapsulant and the lower substrate, the bottom interconnects directly on the lower substrate, the chip encapsulant fully separated from the lower substrate by the gap;
interconnecting the upper substrate and the lower substrate; and
filling the gap with a package encapsulant with a portion of a surface of the upper substrate opposite the upper chip covered by the package encapsulant.

9. The method as claimed in claim 8 further comprising interconnecting the upper chip and the upper substrate by solder bumps or bond wires.

10. The method as claimed in claim 8 further comprising spacing the upper chip from the lower chip to prevent contact between interconnections between the upper chip and the upper substrate, and the lower chip wherein the interconnections are bond wires.

11. The method as claimed in claim 8 wherein positioning the lower chip positions a lower chip larger than the upper chip and having a spacer therebetween.

12. The method as claimed in claim 8 further comprising:
providing a middle substrate having a middle chip thereon and having interconnects therebetween;
connecting the upper chip to the middle substrate by interconnects therebetween; and
connecting the middle substrate to the lower substrate by a stud or solder ball in the chip encapsulant.

13. The method as claimed in claim 8 wherein:
providing the upper substrate provides the upper substrate with an opening provided therein; and
interconnecting the upper chip and the upper substrate through the opening using bond wires.

14. The method as claimed in claim 8 wherein:
filling the gap with package encapsulant leaves the upper substrate exposed; and
connecting a known-good package to the exposed upper substrate.

* * * * *